US012648097B2

(12) United States Patent
Mao et al.

(10) Patent No.: US 12,648,097 B2
(45) Date of Patent: Jun. 2, 2026

(54) FOLDABLE DISPLAY DEVICE

(71) Applicant: Huawei Technologies Co., Ltd.,
Shenzhen (CN)

(72) Inventors: Weihua Mao, Shanghai (CN); Weidong Yu, Shanghai (CN); Jianqing Sheng, Shanghai (CN); Yi Xu, Shanghai (CN); Bo Wu, Shanghai (CN); Bo Huang, Shanghai (CN)

(73) Assignee: Huawei Technologies Co., Ltd.,
Shenzhen (CN)

( * ) Notice: Subject to any disclaimer, the term of this patent is extended or adjusted under 35 U.S.C. 154(b) by 296 days.

(21) Appl. No.: 18/564,521

(22) PCT Filed: Apr. 1, 2022

(86) PCT No.: PCT/CN2022/084889
§ 371 (c)(1),
(2) Date: Nov. 27, 2023

(87) PCT Pub. No.: WO2022/262373
PCT Pub. Date: Dec. 22, 2022

(65) Prior Publication Data
US 2025/0089189 A1     Mar. 13, 2025

(30) Foreign Application Priority Data

Jun. 17, 2021    (CN) .......................... 202110673679.0

(51) Int. Cl.
| | |
|---|---|
| *H05K 5/02* | (2006.01) |
| *G06F 1/16* | (2006.01) |
| *H05K 7/20* | (2006.01) |

(52) U.S. Cl.
CPC ......... *H05K 5/0226* (2013.01); *G06F 1/1652* (2013.01); *G06F 1/1681* (2013.01); *H05K 7/20963* (2013.01)

(58) Field of Classification Search
CPC ........................ H05K 5/0226; H05K 7/20963; G06F 1/1652; G06F 1/1681; G06F 1/1683;
(Continued)

(56) References Cited

U.S. PATENT DOCUMENTS

| | | | | |
|---|---|---|---|---|
| 11,899,506 B2 * | 2/2024 | Cavallaro | .......... | H05K 7/20954 |
| 2020/0028123 A1 * | 1/2020 | Xie | ........................ | H10K 71/00 |

(Continued)

FOREIGN PATENT DOCUMENTS

| | | |
|---|---|---|
| CN | 209402552 U | 9/2019 |
| CN | 109076720 B | 1/2020 |

(Continued)

*Primary Examiner* — Lewis G West

(74) *Attorney, Agent, or Firm* — Slater Matsil, LLP

(57) ABSTRACT
A foldable display device includes a first frame, a second frame, a rotating shaft assembly, a flexible heat sink and a flexible circuit board. The flexible heat sink and the flexible circuit board passes through the rotating shaft assembly, and the rotating shaft assembly includes a shaft seat, a door plate, a first support plate, and a second support plate. Two opposite ends of the flexible heat sink are connected to the first frame and the second frame, and two opposite ends of a part of the flexible heat sink in the rotating shaft assembly are respectively fastened to a first fastening surface that is of the first support plate and that faces the shaft seat and a second fastening surface that is of the second support plate and that faces the shaft seat.

20 Claims, 10 Drawing Sheets

(58) Field of Classification Search
CPC ..... G06F 1/203; H04M 1/0268; H04M 1/022;
H04M 1/0216; G09F 9/301
See application file for complete search history.

(56) References Cited

U.S. PATENT DOCUMENTS

| | | | | |
|---|---|---|---|---|
| 2020/0043826 A1* | 2/2020 | Koller | ................. | H01L 23/3675 |
| 2020/0204666 A1* | 6/2020 | Hong | ..................... | G06F 1/203 |
| 2020/0356143 A1* | 11/2020 | Oh | ......................... | G06F 1/1616 |
| 2021/0041921 A1* | 2/2021 | Kang | ................... | H04M 1/022 |
| 2021/0373628 A1* | 12/2021 | Lin | ....................... | G06F 1/1683 |
| 2023/0422448 A1* | 12/2023 | Huh | ................... | H05K 7/20481 |
| 2024/0349530 A1* | 10/2024 | Nishimura | .......... | H04M 1/0269 |
| 2025/0392660 A1* | 12/2025 | Jung | ................... | H04M 1/0268 |

FOREIGN PATENT DOCUMENTS

| | | | |
|---|---|---|---|
| CN | 110750135 | A | 2/2020 |
| CN | 110827695 | A | 2/2020 |
| CN | 111147630 | A | 5/2020 |
| CN | 212155434 | U | 12/2020 |
| CN | 112365798 | A | 2/2021 |
| CN | 212838936 | U | 3/2021 |
| CN | 212850572 | U | 3/2021 |
| CN | 112866447 | A | 5/2021 |
| CN | 214587767 | U | 11/2021 |
| JP | 2008022417 | A | 1/2008 |
| JP | 2009194178 | A | 8/2009 |
| JP | 2020125841 | A | 8/2020 |
| WO | 2020156138 | A1 | 8/2020 |

* cited by examiner

61

FOLDABLE DISPLAY DEVICE

CROSS-REFERENCE TO RELATED APPLICATIONS

This application is a national stage of International Application No. PCT/CN2022/084889, filed on Apr. 1, 2022, which claims priority to Chinese Patent Application No. 202110673679.0, filed on Jun. 17, 2021. The disclosures of the aforementioned applications are hereby incorporated by reference in their entireties.

TECHNICAL FIELD

This application relates to the field of terminal devices, and in particular, to a foldable display device.

BACKGROUND

Currently, a foldable display device usually includes a rotating shaft and two bodies. The rotating shaft is rotatably connected to the two bodies. Electronic elements such as a circuit board are disposed in each body. To implement an electrical connection of electronic elements in the two bodies, the foldable display device connects the two bodies by using a flexible circuit board that may pass through a shaft. Usually, the flexible circuit board reserves an extra length to implement an unfolded state and a folded state of the foldable display device. To prevent the flexible circuit board from being easily broken or scratched against another structure, the flexible circuit board may be redundant in the rotating shaft to reduce a space occupied by the flexible circuit board. Alternatively, the flexible circuit board may be redundant below the door plate of the rotating shaft, but this requires to occupy a large space. In addition, to implement heat dissipation of the electronic elements of the two bodies, graphite sheets may be laid below flexible displays covering surfaces of the two bodies. Specifically, the foldable display device is respectively attached to the two bodies by using two graphite sheets, and is separated from the rotating shaft area. Therefore, heat cannot be transferred between the two bodies, which may result in uneven heat dissipation between the two bodies.

SUMMARY

In view of the above, it is necessary to provide a foldable display device, to avoid uneven heat dissipation between two bodies, and locate two opposite ends of a part of the flexible heat sink in the rotating shaft assembly.

An embodiment of this application provides a foldable display device, where the foldable display device includes a first frame, a second frame, a rotating shaft assembly, and a flexible circuit board. The flexible circuit board passes through the rotating shaft assembly, and the rotating shaft assembly includes a shaft seat, a door plate, a first support plate, and a second support plate. The door plate is mounted on the shaft seat, the first support plate and the second support plate are slidably connected to the shaft seat, the first support plate and the second support plate are distributed on two sides of the door plate, an end that is of the first support plate and that is close to the door plate and an end that is of the second support plate and that is close to the door plate can move in a direction away from the door plate, and an end that is of the first support plate and that is away from the door plate and an end that is of the second support plate and that is away from the door plate can move close to each other. The foldable display device further includes a flexible heat sink, where the flexible heat sink passes through the rotating shaft assembly, and two opposite ends of the flexible heat sink are connected to the first frame and the second frame; and two opposite ends of a part of the flexible heat sink in the rotating shaft assembly are respectively fastened to a first fastening surface that is of the first support plate and that faces the shaft seat and a second fastening surface that is of the second support plate and that faces the shaft seat.

In this application, the flexible heat sink passes through the rotating shaft assembly, the two ends of the flexible heat sink are connected to the first frame and the second frame, and heat transfer between the first frame and the second frame through the flexible heat sink may be implemented. The two opposite ends of a part of the flexible heat sink in the rotating shaft assembly are fastened below the movable first support plate and the movable second support plate, and the two opposite ends of a part of the flexible heat sink in the rotating shaft assembly may be located, so that two opposite ends of a part of the flexible heat sink in the rotating shaft assembly may be located, to avoid a case in which the flexible heat sink move in a length direction when the foldable display device is folded or unfolded, resulting in large-scale deformation and a position change of the flexible heat sink.

According to some embodiments of this application, the flexible heat sink covers the flexible circuit board in the rotating shaft assembly.

In this application, the flexible heat sink covers the flexible circuit board, improving space utilization of the rotating shaft assembly.

According to some embodiments of this application, the rotating shaft assembly further includes a housing, the shaft seat is mounted on the housing, the shaft seat and the housing jointly form an accommodation cavity, and the flexible heat sink and the flexible circuit board are partially received in the accommodation cavity.

In this application, the flexible heat sink and the flexible circuit board are redundant in the accommodation cavity, to avoid fractures of the flexible circuit board and the flexible heat sink and a larger space occupied by the foldable display device.

According to some embodiments of this application, an accommodation groove is formed on the shaft seat, the accommodation groove penetrates through the shaft seat, the shaft seat and the housing jointly form the accommodation cavity at the accommodation groove, a cross beam is further formed on the shaft seat at the accommodation groove, and the cross beam is separated from the housing; and a middle segment position of the flexible heat sink is fastened to a surface that is of the cross beam and that faces the housing.

In this application, the shaft seat forms the cross beam at the accommodation cavity that receives the flexible heat sink, and the middle segment position of the flexible heat sink is fastened below the cross beam, so that the middle segment position of the flexible heat sink may be located, and the flexible heat sink may be divided, in a length direction, into two segments with similar lengths. Therefore, displacement and bending deformation that are generated, when the flexible heat sink is folded or unfolded, by the foldable display device are smaller, and displacement and a bending amount may be more easily controlled.

According to some embodiments of this application, the cross beam extends from a first side wall of the shaft seat near the accommodation groove to a second side wall that is opposite to the first side wall, and is separated from another side wall of the shaft seat near the accommodation groove.

According to some embodiments of this application, the cross beam and another side wall of the shaft seat near the accommodation groove form a first interval and a second interval, and the flexible heat sink and the flexible circuit board enter the accommodation cavity through the first interval and leave the accommodation cavity through the second interval.

In this application, the cross beam and the shaft seat form the first interval and the second interval, so that the flexible heat sink and the flexible circuit board enter the accommodation cavity through the first interval and leave the accommodation cavity through the second interval, and the flexible heat sink and the flexible circuit board may pass through the rotating shaft assembly.

According to some embodiments of this application, the housing includes an inner housing surface and a positioning member, the positioning member is fixedly mounted on the inner housing surface and is located in the accommodation cavity, and the cross beam and the positioning member are separated from each other and jointly locate middle segment positions of the flexible circuit board and the flexible heat sink.

In this application, a positioning member mounted in the housing and the cross beam jointly locate the middle segment positions of the flexible circuit board and the flexible heat sink, so that the flexible circuit board and the flexible heat sink may be divided, in a length direction, into two segments with similar lengths. Therefore, displacement and bending deformation that are generated, when the flexible circuit board and the flexible heat sink are folded or unfolded, by the foldable display device are smaller, and displacement and a bending amount may be more easily controlled.

According to some embodiments of this application, the foldable display device further includes a buffer member, the buffer member is disposed on the positioning member and is separated from the cross beam, and the buffer member is configured to avoid damage to the flexible circuit board by the positioning member through elastic deformation.

In this application, the buffer member is disposed on the positioning member and is separated from the cross beam, so that damage to the flexible circuit board by the positioning member can be avoided. In addition, a connection position between the flexible circuit board and the cross beam can be slightly changed by using the buffer member, to avoid a risk of a fracture due to the stretched flexible circuit board.

According to some embodiments of this application, a first side of the first frame and a first side of the second frame are configured to mount a flexible display, and a second side of the first frame and a second side of the second frame are configured to mount an electronic element; the two opposite ends of the flexible heat sink are connected to the first side of the first frame and the first side of the second frame; and two opposite ends of the flexible circuit board are connected to a second side of the first frame and a second side of the second frame, and the second side is opposite to the first side.

In this application, the flexible heat sink and the flexible circuit board are disposed on different sides of the first frame and the second frame, so that heat dissipation of the flexible heat sink to the frame and connection of electronic components to the flexible circuit board may be implemented, and mutual interference between the flexible heat sink and the flexible circuit board can be avoided.

According to some embodiments of this application, the foldable display device further includes a first bracket, a second bracket, a first synchronization arm, a second synchronization arm, and a cam wheel structure; where the first bracket is rotatably connected to the first support plate, the second bracket is rotatably connected to the second support plate, and the first bracket and the second bracket are rotatably connected to the shaft seat; the first synchronization arm is slidably connected to the first bracket and is rotatably connected to the first bracket, and the second synchronization arm is slidably connected to the second bracket and is rotatably connected to the second bracket; and the cam wheel structure is disposed on the shaft seat and includes a concave and convex structure, and the first synchronization arm and the second synchronization arm are connected to the cam wheel structure through the concave and convex structure, to implement damping of rotation of the first bracket and the second bracket.

In this application, the first synchronization arm and the second synchronization arm are connected to the cam wheel structure through the concave and convex structure, to implement damping of rotation of the first bracket and the second bracket, so that a speed of folding or unfolding the foldable display device can be slightly slow, to improve folding or unfolding stability of the foldable display device, and improve use experience of a user.

DETAILED DESCRIPTION OF THE EMBODIMENTS

Terms "first" and "second" mentioned below are merely intended for a purpose of description, and shall not be understood as an indication or implication of relative importance or implicit indication of a quantity of indicated technical features. Therefore, a feature limited by "first" or "second" may explicitly indicate or implicitly include one or more features. In the description of embodiments of this application, words such as "for example" are used to indicate examples, illustrations, or descriptions. Any embodiment or design scheme described as an "example" or "for example" in embodiments of this application should not be explained as being more preferred or having more advantages than another embodiment or design scheme. Specifically, the words such as "for example" are intended to present relevant concepts in a specific manner.

Unless otherwise defined, all technical terms and scientific terms used in this specification have the same meaning as those commonly understood by those skilled in the art of this application. The terms used in this application are merely intended to describe specific embodiments, but not intended to limit this application.

Figure 1:
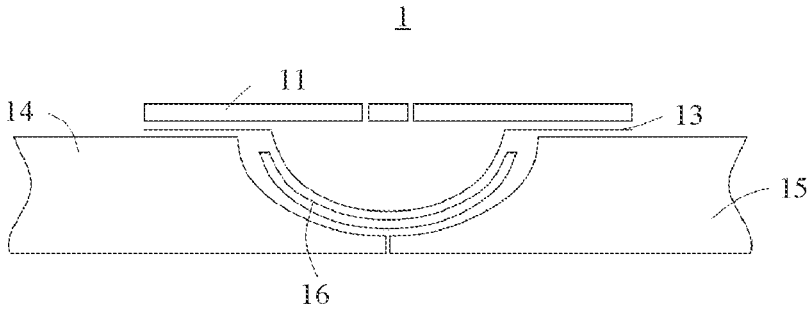
FIG. 1 is a schematic diagram of a structure of a conventional foldable display device in a flattened state.
Figure 2:
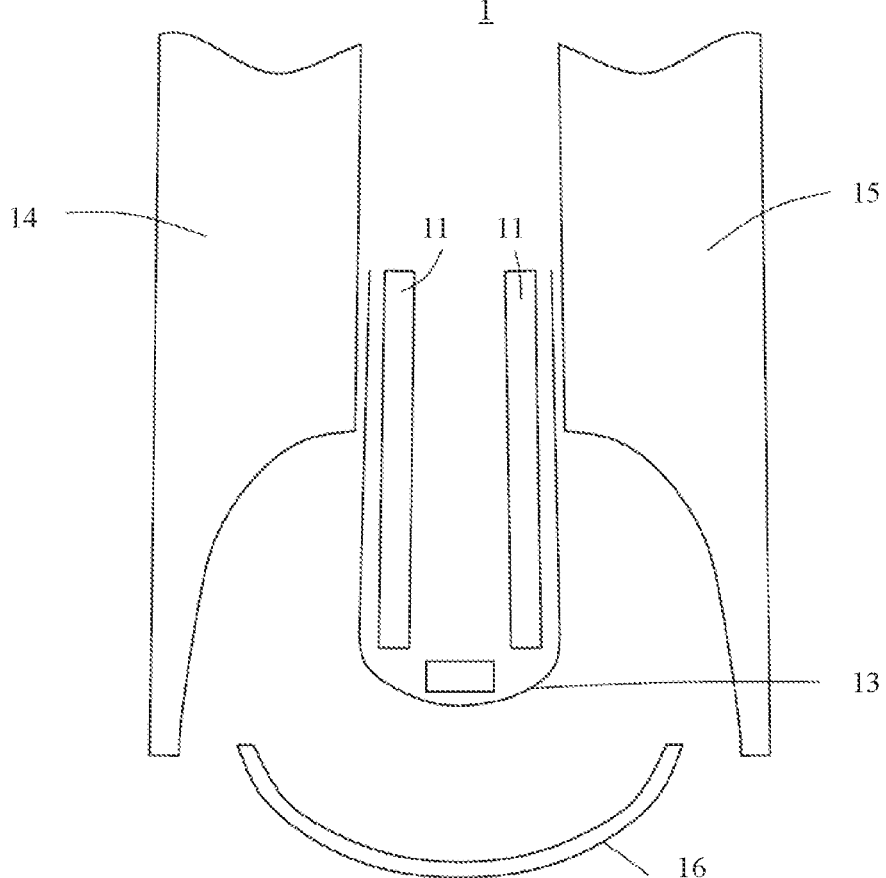
FIG. 2 is a schematic diagram of a structure of a conventional foldable display device in a folded state.

FIG. 1 is a schematic diagram of a structure of a conventional foldable display device in a flattened state; and FIG. 2 is a schematic diagram of a structure of a conventional foldable display device in a folded state. A foldable display device 1 assists in locating two ends of the flexible circuit board 13 that may pass through a shaft by using a steel sheet 11. Specifically, the foldable display device 1 includes a first frame 14, a second frame 15, and a rotating shaft assembly 16. The rotating shaft assembly 16 is rotatably connected between the first frame 14 and the second frame 15. The flexible circuit board 13 passes through the rotating shaft assembly 16 and is connected to the first frame 14 and the second frame 15. The steel sheet 11 is pressed on the flexible circuit board 13, and may be fastened to the first frame 14 and the second frame 15 in a manner, for example, locking a screw or a buckle, so that the flexible circuit board 13 may be fastened to the first frame 14 and the second frame 15 that are of the foldable display device 1. However, the conventional foldable display device 1 is only configured for the flexible circuit board 13 to pass through in an area of the rotating shaft assembly 16, space utilization of the rotating shaft assembly 16 is low, and heat dissipation of the conventional first frame 14 and the second frame 15 is uneven.

Figure 3:
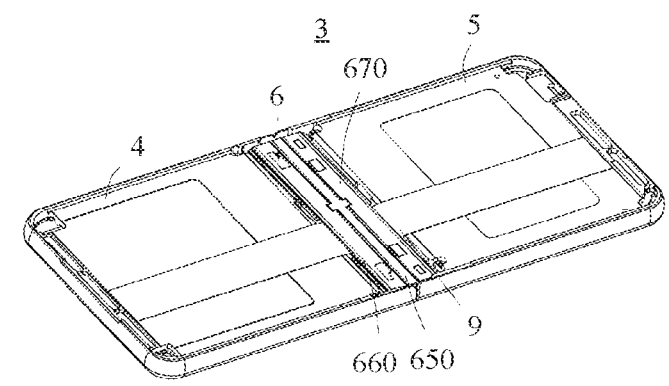
FIG. 3 is a schematic diagram of a structure of a foldable display device in a flattened state according to a first embodiment of this application.
Figure 4:
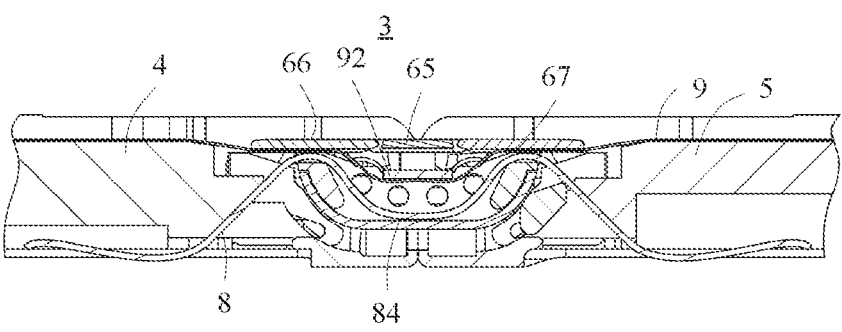
FIG. 4 is a schematic sectional view of a foldable display device in a flattened state according to a first embodiment of this application.
Figure 5:
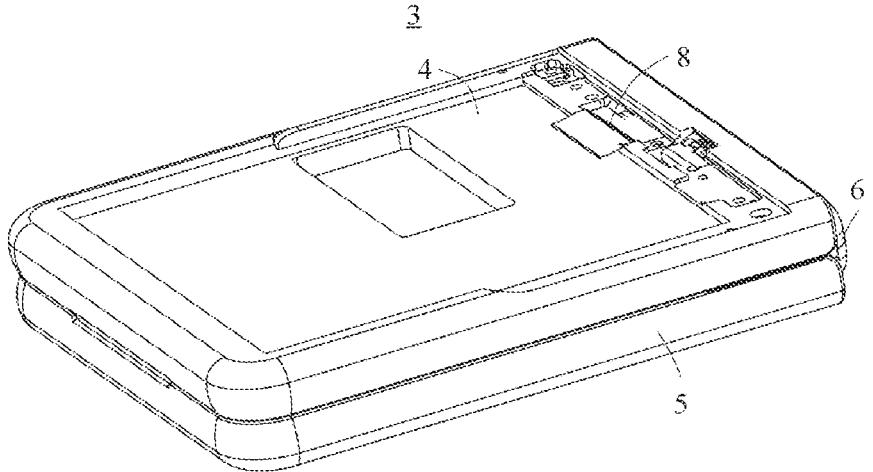
FIG. 5 is a schematic diagram of a structure of a foldable display device in a folded state according to a first embodiment of this application.
Figure 6:
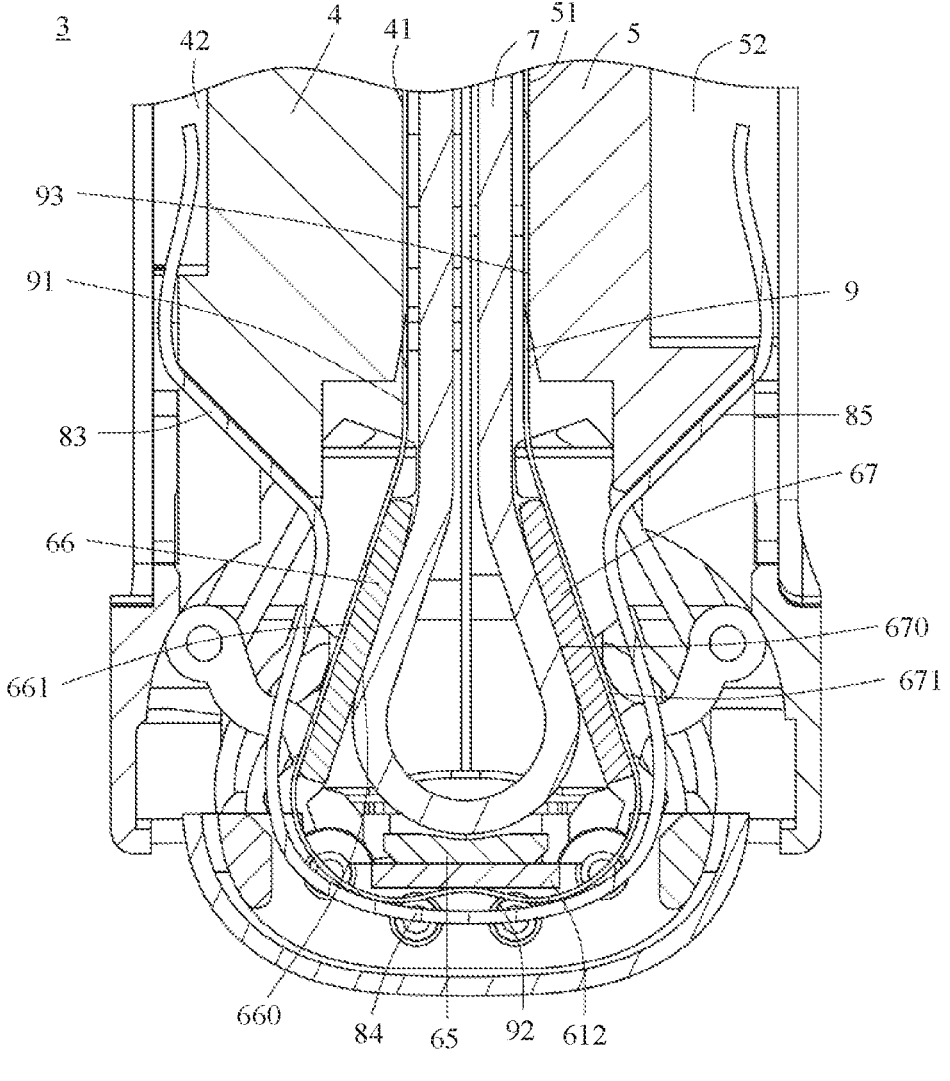
FIG. 6 is a schematic sectional view of a foldable display device in a folded state according to a first embodiment of this application.

Refer to FIG. 3 to FIG. 6. FIG. 3 is a schematic diagram of a structure of a foldable display device in a flattened state according to this application; FIG. 4 is a schematic exploded view of a foldable display device in a flattened state according to a first embodiment of this application; FIG. 5 is a schematic diagram of a structure of a foldable display device in a folded state according to a first embodiment of this application; and FIG. 6 is a schematic exploded view of a foldable display device in a folded state according to a first embodiment of this application. The foldable display device 1 may be a foldable display mobile phone, a foldable display e-book, a foldable display laptop computer, or the like. The following specifically describes the solution provided in this embodiment of this application by using an example in which this embodiment of this application is applied in a foldable display mobile phone. A flexible display is not shown in FIG. 3 and FIG. 4. However, it may be understood that, when the foldable display device is in an unfolded state, the flexible display is included.

A foldable display device 3 includes a first frame 4, a second frame 5, a rotating shaft assembly 6, a flexible display 7, a flexible circuit board 8, and a flexible heat sink 9. Electronic elements inside the foldable display device 3, such as a circuit board, a processor, a memory, a battery, a camera module, an earpiece module, a speaker module, a microphone module, an antenna module, and a sensor module, may be separately fastened to the first frame 4 and the second frame 5. The first frame 4 and the second frame 5 are rotatably connected by using the rotating shaft assembly 6, and may be rotated around the rotating shaft assembly 6 to a flattened state or a folded state. The flexible display 7 covers both the first frame 4 and the second frame 5. The flexible circuit board 8 passes through the rotating shaft assembly 6 and is connected to the first frame 4 and the second frame 5, to implement connection of electronic elements in the first frame 4 and the second frame 5. The flexible heat sink 9 passes through the rotating shaft assembly 6, two ends of the flexible heat sink 9 are connected to the first frame 4 and the second frame 5, and the two ends of the flexible heat sink 9 are fastened to the first frame 4 and the second frame 5. The flexible heat sink 9 and the flexible circuit board 8 pass through the rotating shaft assembly 6 through a same area of the rotating shaft assembly 6. The flexible heat sink 9 may transfer heat of the first frame 4 and heat of the second frame 5 to each other, so that temperatures of the first frame 4 and the second frame 5 are even. The flexible heat sink 9 may be made of a thermally conductive material. The thermal conductive material may be a material, for example, graphite or carbon fiber. To implement an unfolded state and a folded state of the foldable display device 3, the flexible circuit board 8 and the flexible heat sink 9 reserve an extra length. When the foldable display device 3 is in an unfolded state, as shown in FIG. 3, the first frame 4 and the second frame 5 are approximately parallel to each other and coplanar, and in this case, the flexible display 7 unfolds to form a larger display area. Apparently, the first frame 4 and the second frame 5 may not be approximately parallel, that is, an included angle existing between the first frame 4 and the second frame 5 may have some deviations relative to 180°. For example, an included angle between the first frame 4 and the second frame 5 may be 176°, 182°, or the like. When the foldable display device 3 is in a folded state, the first frame 4 and the second frame 5 may be completely closed, and there is no gap or a small gap between the first frame 4 and the second frame 5, which can play a good role in waterproofing, dustproofing and anti-foreign matter. The first frame 4 and the second frame 5 can be fully closed to expose the rotating shaft assembly 6. In this way, the first frame 4, the second frame 5, and the rotating shaft assembly 6 jointly form an external surface of the foldable display device 3, and the flexible display 7 is also in a folded state, and is located on an inner side of the foldable display device 3, and the foldable display device 3 has a small size. It may be understood that the first frame 4 and the second frame 5 may not be completely closed, but only ends that are of the first frame 4 and the second frame 5 and that are away from the rotating shaft assembly 6 are in contact with each other.

It may be understood that the first frame 4 and the second frame 5 may also be relatively unfolded or relatively folded to an intermediate state, the intermediate state may be any state between the flattened state and the folded state, and the flexible display 7 moves with the first frame 4 and the second frame 5.

It may be understood that the foldable display device 3 may include two frames, for example, the foregoing first frame 4 and the foregoing second frame 5, or the foldable display device 3 may include three or more frames. Each two adjacent frames may be connected by using a rotating shaft assembly 6. The flexible display 7 covers the three or more frames. The following specifically describes the solution provided in this embodiment of this application by using an example in which the foldable display device 3 includes two frames.

Figure 7:
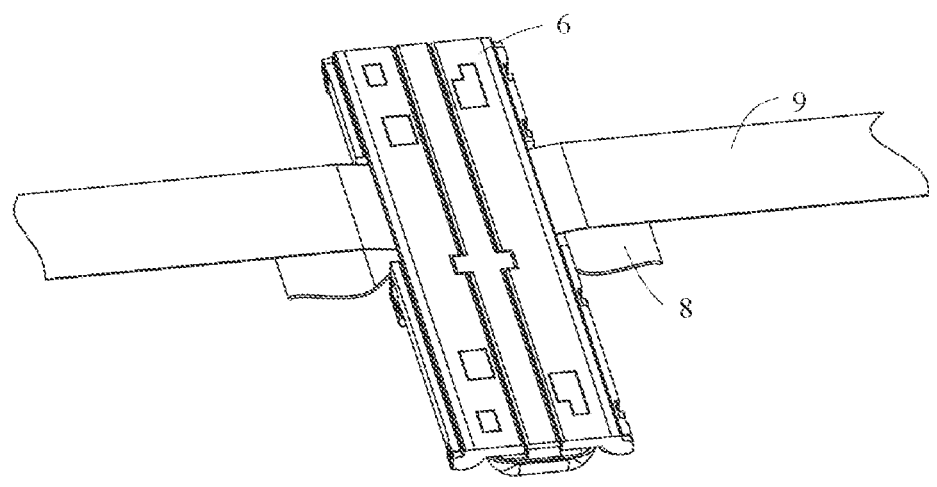
FIG. 7 is a schematic diagram of a connection between a rotating shaft assembly, a flexible circuit board, and graphite of the foldable display device shown in FIG. 4.

With reference to FIG. 4 and FIG. 7, FIG. 7 is a schematic diagram of a connection between a rotating shaft assembly, a flexible circuit board, and a flexible heat sink of the foldable display device. As shown in FIG. 7, to prevent the flexible circuit board 8 and the flexible heat sink 9 from being easily broken or scratched against another structure, the flexible circuit board 8 and the flexible heat sink 9 pass through the rotating shaft assembly 6 and are redundant in the rotating shaft assembly 6. The flexible circuit board 8 may be located at a position of an end part by using a first positioning apparatus and a second positioning apparatus. For example, the position of an end part of the flexible circuit board 8 is fastened to the first frame 4 and the second frame 5 by using a first steel sheet and a second steel sheet, so that large-scale deformation and a position change of the flexible circuit board 8 may be avoided when the foldable display device 3 is folded or unfolded. The flexible heat sink 9 is located by rotating shaft assembly 6 in the rotating shaft assembly 6. The flexible heat sink 9 is located by rotating shaft assembly 6 in the rotating shaft assembly 6, and this is further described in detail in the following.

Figure 8:
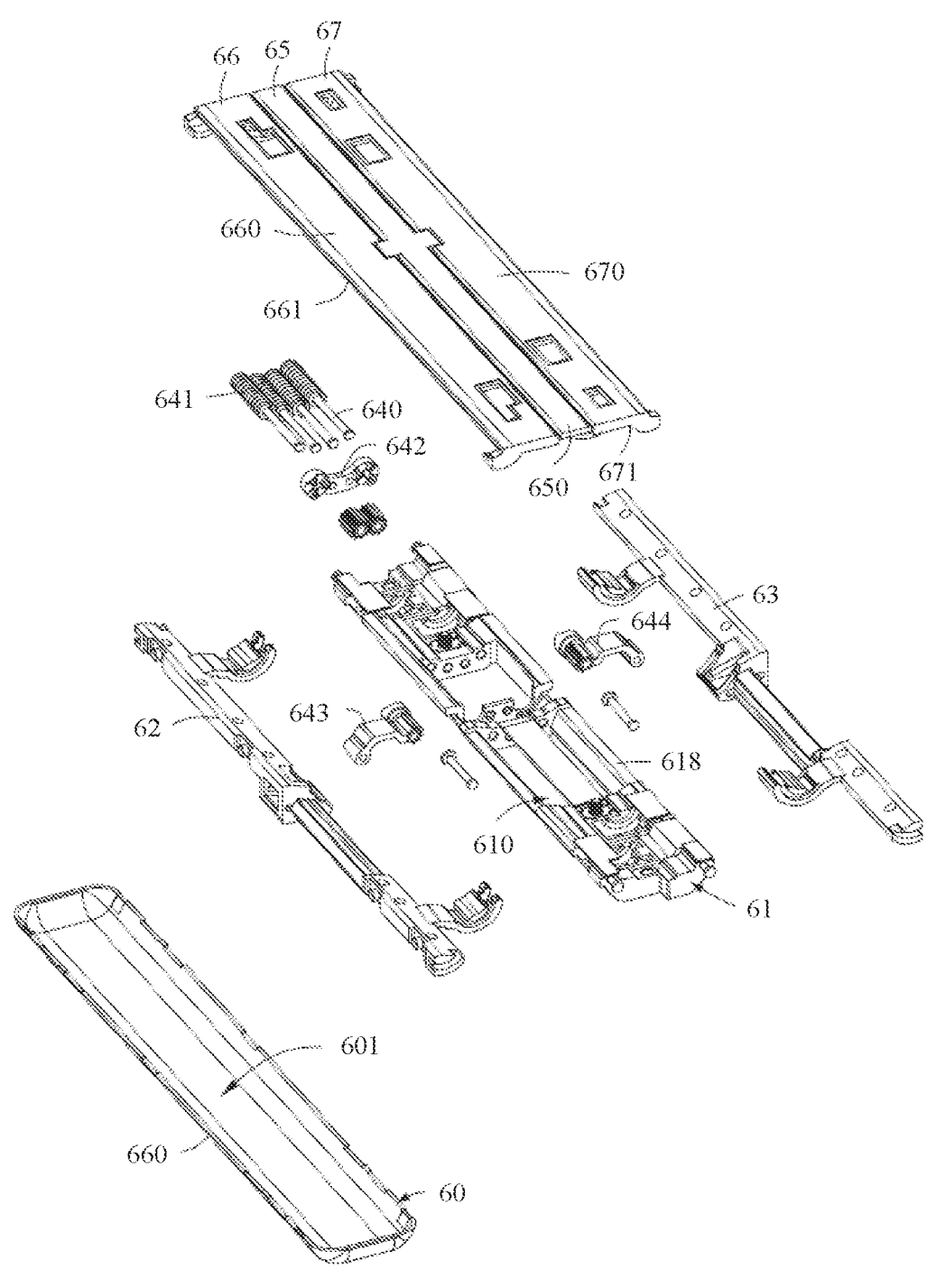
FIG. 8 is a schematic exploded view of the rotating shaft assembly of the foldable display device shown in FIG. 7.
Figure 9:
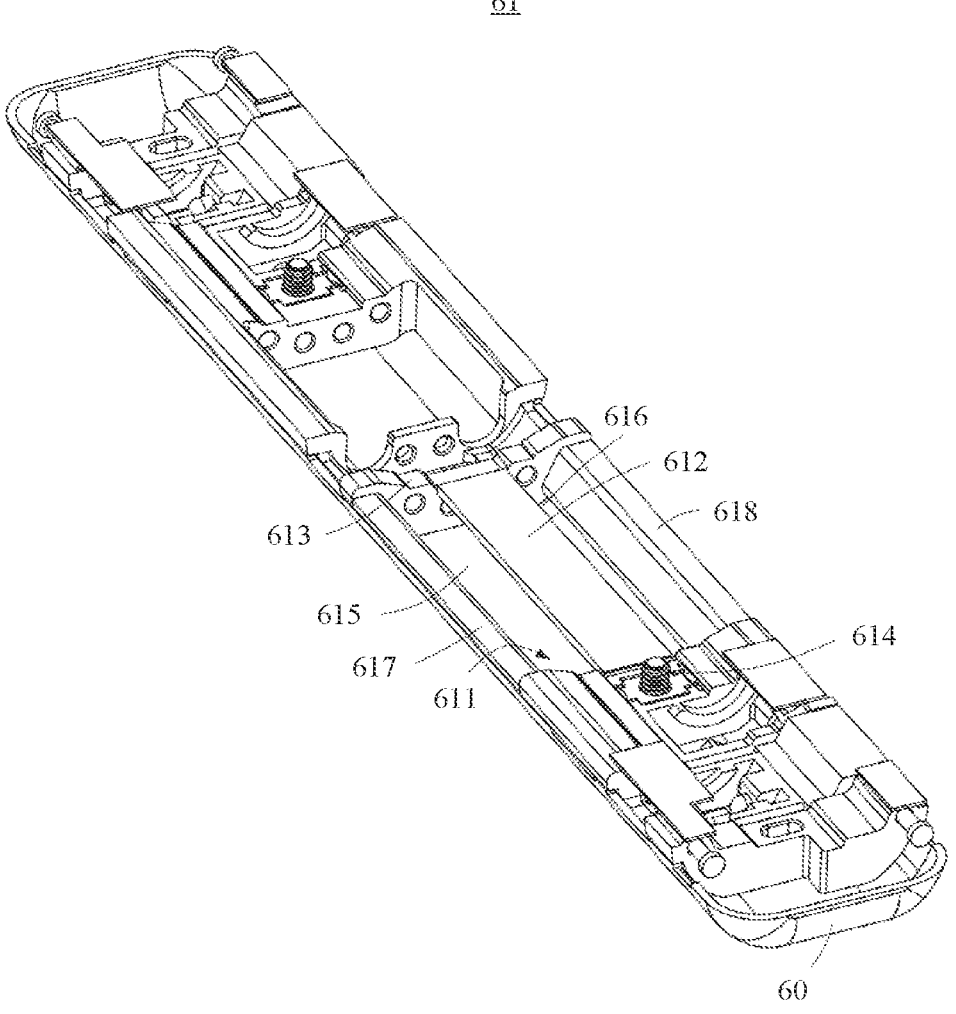
FIG. 9 is a schematic diagram of a structure in which a shaft seat of the rotating shaft assembly shown in FIG. 8 is mounted on a housing.
Figure 10:
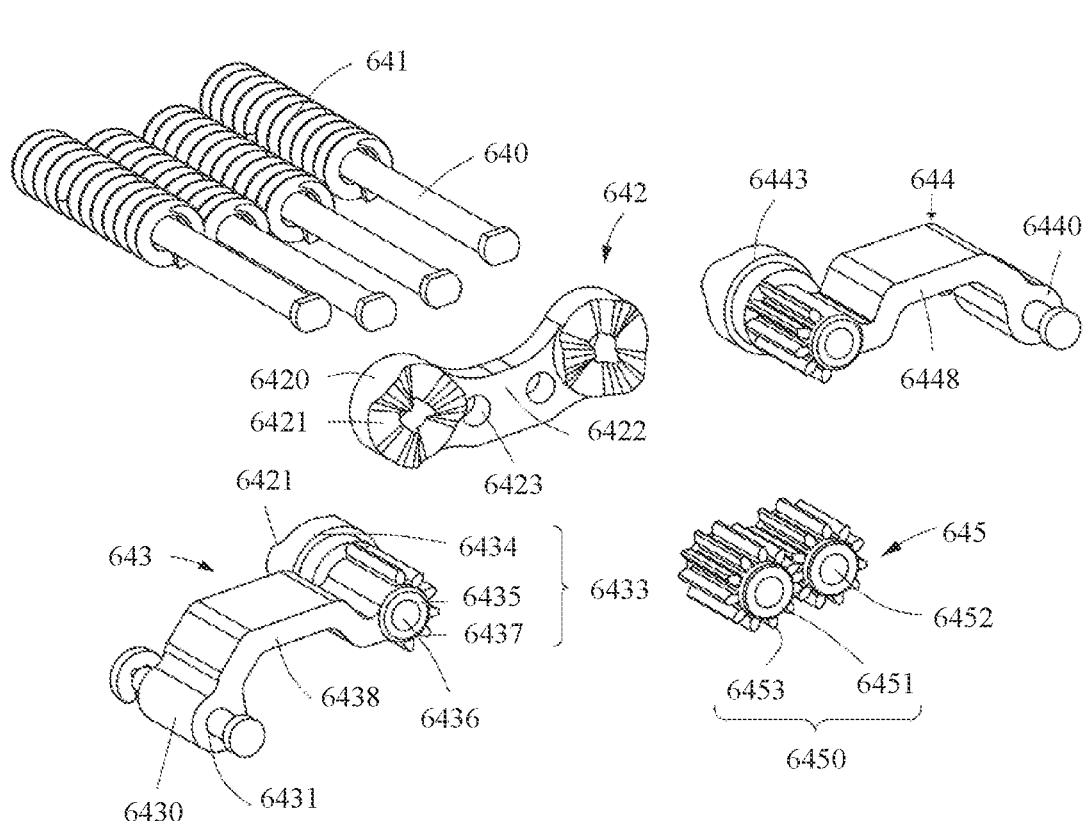
FIG. 10 is a schematic exploded view of a damping apparatus of the rotating shaft assembly shown in FIG. 8.

FIG. 8 is a schematic exploded view of the rotating shaft assembly of the foldable display device; and FIG. 9 is a schematic diagram of a structure in which a shaft seat of the rotating shaft assembly is mounted on a housing. The rotating shaft assembly 6 includes a housing 60, a shaft seat 61, a first bracket 62, a second bracket 63, a damping apparatus 64, a door plate 65, a first support plate 66, and a second support plate 67.

The housing 60 includes a housing surface 600 and a mounting cavity 601. The housing surface 600 is a smooth surface, and the shaft seat 61 is mounted in the mounting cavity 601.

With reference to FIG. 6, FIG. 8, and FIG. 9, the shaft seat 61 may be mounted in the mounting cavity 601 of the housing 60 by using a fastening structure (for example, may be a screw or a bolt), or the shaft seat 61 may be mounted in the mounting cavity 601 of the housing 60 in an adhesive, welding, a snap-fit, or another manner. This is not limited in this application. An accommodation groove 610 is formed on the shaft seat 61, and the accommodation groove 610 penetrates through the shaft seat 61. The shaft seat 61 and the housing 60 jointly form an accommodation cavity 611 at the accommodation groove 610. The accommodation cavity 611 is configured to receive the flexible circuit board 8 and the flexible heat sink 9. In this embodiment, the flexible heat sink 9 and the flexible circuit board 8 are partially received in the accommodation cavity 611.

A cross beam 612 is further formed on the shaft seat 61 at the accommodation groove 610. The cross beam 612 extends from a first side wall 613 of the shaft seat 61 near the accommodation groove 610 to a second side wall 614 that is opposite to the first side wall 613, and therefore the cross beam 612 covers a part of the accommodation groove 610. The cross beam 612 is separated from another side wall of the shaft seat 61 near the accommodation groove 610 to form a first interval 615 and a second interval 616. In FIG. 9, the cross beam 612 is separated from a third side wall 617 and a fourth side wall 618 of the shaft seat 61 near the accommodation groove 610 to form the first interval 615 and the second interval 616. The cross beam 612 is separated from the housing 60. The flexible circuit board 8 and the flexible heat sink 9 enter the accommodation cavity 611 through a first interval 615, are redundant in the accommodation cavity 611, and leave the accommodation cavity 611 through a second interval 616. In the accommodation cavity 611, the flexible heat sink 9 is located above the flexible circuit board 8 and covers the flexible circuit board 8, and the flexible heat sink 9 may be in contact with the flexible circuit board 8, or may not be in contact with the flexible circuit board 8. In the accommodation cavity 611, a size of the flexible heat sink 9 in a length direction of the rotating shaft assembly 6 may be equal to a size of an area occupied by the flexible circuit board 8 in the direction. In this case, all areas of the flexible circuit board 8 in the rotating shaft assembly 6 are covered by the flexible heat sink 9, so that there is no need for an additional space of the rotating shaft assembly 6 to receive the flexible heat sink 9, thereby improving space utilization of the rotating shaft assembly 6.

The first bracket 62 may be rotatably connected to the shaft seat 61, the second bracket 63 may be rotatably connected to the shaft seat 61, the first bracket 62 and the second bracket 63 are disposed on two opposite sides of the shaft seat 61, and the shaft seat 61 is mounted in the housing 60. The first bracket 62 is fixedly connected to the first frame 4, and the second bracket 63 is fixedly connected to the second frame 5. Therefore, when the first bracket 62 rotates relative to the shaft seat 61 and the second bracket 63 rotates relative to the shaft seat 61, the first frame 4 moves relative to the second frame 5, that is, the first frame 4 driven by the first bracket 62 and the second frame 5 driven by the second bracket 63 are relatively folded or relatively unfolded.

Figure 11:
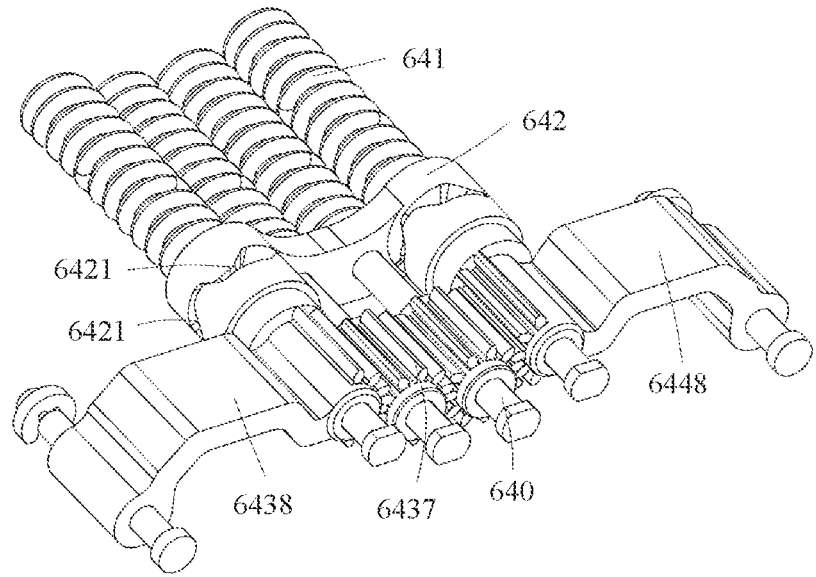
FIG. 11 is a schematic assembly diagram of a damping apparatus of the rotating shaft assembly shown in FIG. 8.

With reference to FIG. 4, FIG. 8, FIG. 9, FIG. 10, and FIG. 11, FIG. 10 is a schematic exploded view of a damping apparatus of the rotating shaft assembly; and FIG. 11 is a schematic assembly diagram of a damping apparatus of the rotating shaft assembly. The damping apparatus 64 may be mounted on the shaft seat 61. The damping apparatus 64 includes a rotating shaft 640, an elastic member 641, a cam wheel structure 642, a first damping arm 643, and a second damping arm 644. The rotating shaft 640 may be mounted on the shaft seat 61. The rotating shaft 640 is configured to connect to the cam wheel structure 642, the first damping arm 643, and the second damping arm 644. In this embodiment, there are a plurality of rotating shafts 640. The plurality of rotating shafts 640 are spaced on the shaft seat 61, and the plurality of rotating shafts 640 separately cooperate with the cam wheel structure 642, the first damping arm 643, and the second damping arm 644, to implement rotation connection between each of the cam wheel structure 642, the first damping arm 643, and the second damping arm 644 and the shaft seat 61. It should be noted that there are four rotating shafts 640 in FIG. 9, and the following specifically describes the solution provided in this embodiment of this application by using an example in which the damping apparatus 64 includes four rotating shafts 640. However, a quantity of rotating shafts 640 in this embodiment is not limited to four. FIG. 9 is merely an example representation. A quantity of rotating shafts 640 may be three, five, or the like, and may be disposed based on a requirement and a mounting space. The elastic member 641 is sleeved onto the rotating shaft 640.

The cam wheel structure 642 is sleeved onto the rotating shaft 640 to abut on an end of the elastic member 641. The cam wheel structure 642 includes two first cam wheels 6420 that are fixedly connected. The two first cam wheels 6420 are sleeved onto the outermost side of two rotating shafts 640. A concave and convex structure 6421 is disposed on each of surfaces that is of the first cam wheel 6420 and that is away from the elastic member 641. In this embodiment, the two first cam wheels 6420 are fixedly connected by using a connector 6422. A through hole 6423 is formed on the connector 6422. The through hole 6423 is configured for two rotating shafts 640 in the middle to pass through.

An end of the first damping arm 643 is slidably connected to the first bracket 62, the other end of the first damping arm 643 is rotatably connected to the shaft seat 61 and is engaged with the cam wheel structure 642 on the shaft seat 61 by using the concave and convex structure 6421. An end of the second damping arm 644 is slidably connected to the second bracket 63, the other end of the second damping arm 644 rotatably connected to the shaft seat 61 and is engaged with the cam wheel structure 642 on the shaft seat 61 by using the concave and convex structure 6421. The cam wheel structure 642 is configured to hinder movement of the first damping arm 643 and the second damping arm 644 in a process of moving the foldable display device 3, slow down movement of the first bracket 62 and the second bracket 63 driven by the first damping arm 643 and the second damping arm 644, and slow down movement of the first frame 4 and the second frame 5 driven by the first bracket 62 and the second bracket 63, to implement stability of folding or unfolding the first frame 4 and the second frame 5, to improve operation experience of the foldable display device 3.

The first damping arm 643 includes a movable end 6430, a damping end 6433, and a connection segment 6438, and the connection segment 6438 is connected to the movable end 6430 and the damping end 6433. A rotating shaft hole 6431 is disposed on an end that is of the movable end 6430 of the first damping arm 643 and that is away from the connection segment 6438. The rotating shaft hole 6431 penetrates through the movable end 6430. The first damping arm 643 is slidably connected to the first bracket 62 by using the rotating shaft hole 6431. The damping end 6433 of the first damping arm 643 is in contact with the cam wheel structure 642. The damping end 6433 of the first damping arm 643 includes a second cam wheel 6434. The concave and convex structure 6421 is disposed on a surface that is of the second cam wheel 6434 and that is in contact with the first cam wheel 6420. The second cam wheel 6434 is engaged with the first cam wheel 6420 by using the concave and convex structure 6421. The first damping arm 643 may be integrally formed into a structural member to have a high structural strength.

The second damping arm 644 includes a movable end 6440, a damping end 6443, and a connection segment 6448, and the connection segment 6448 is connected to the movable end 6440 and the damping end 6443. For a specific structure of the movable end 6440 and the damping end 6443 that are of the second damping arm 644, refer to a structure of the movable end 6440 and the damping end 6443 that are of the first damping arm 643. Details are not described herein again. The second damping arm 644 may be integrally formed into a structural member to have a high structural strength.

In a process of switching between a flattened state and a folded state, the first damping arm 643 rotates relative to the shaft seat 61, and the first damping arm 643 slides relative to the first bracket 62 and rotates relative to the first bracket 62. The second damping arm 644 rotates relative to the shaft seat 61, and the second damping arm 644 can slide relative to the second bracket 63 and rotate relative to the second bracket 63. In this case, the damping apparatus 64 may provide damping for rotation and sliding of the first damping arm 643 and the second damping arm 644. Specifically, the first damping arm 643 rotates relative to the shaft seat 61, and the damping end 6433 of the first damping arm 643 drives the cam wheel structure 642 toward the elastic member 641 by using the concave and convex structure 6421, to further compress the elastic member 641 or drive the elastic member 641 to rotate. The second damping arm 644 rotates relative to the shaft seat 61, and the damping end 6443 of the second damping arm 644 drives the cam wheel structure 642 toward the elastic member 641 by using the concave and convex structure 6421, to further compress the elastic member 641 or drive the elastic member 641 to rotate. Therefore, the elastic member 641 may provide an opening/closing damping force. In this way, in a process in which the first damping arm 643 drives the first bracket 62 and the second damping arm 644 drives the second bracket 63 to rotate synchronously, the opening/closing damping force provided by the elastic member 641 may slow down a speed of folding or unfolding the foldable display device 3, improve stability of folding or unfolding the foldable display device 3, and improve use experience of a user.

Because the two first cam wheels 6420 of the cam wheel structure 642 are fixedly connected, magnitudes of rotation angles that are of the damping end 6433 of the first damping arm 643 and the damping end 6443 of the second damping arm 644 are the same, and rotation actions that are of the first damping arm 643 and the second damping arm 644 relative to the shaft seat 61 are synchronous. The first damping arm 643 and the second damping arm 644 drive the first bracket 62 and the second bracket 63 to move synchronously, and the first bracket 62 and the second bracket 63 drive the first frame 4 and the second frame 5 to move synchronously, thereby implementing relative folding or relative unfolding of the first frame 4 and the second frame 5, and improving use experience of a user.

The damping apparatus 64 further includes a synchronization apparatus 645, and the synchronization apparatus 645 may be mounted on the shaft seat 61. The synchronization apparatus 645 is rotatably connected to the shaft seat 61. The other end of the first damping arm 643 further meshes with the synchronization apparatus 645 on the shaft seat 61 by using a gear. The other end of the second damping arm 644 further meshes with the synchronization apparatus 645 on the shaft seat 61 by using a gear. The synchronization apparatus 645 may include two synchronization gears 6450, where the synchronization gears 6450 include a first rotating part 6451 and a first gear part 6453 disposed around the first rotating part 6451, the first rotating part 6451 is provided with a first rotating hole 6452, and the first rotating hole 6452 penetrates through the first rotating part 6451. The first rotating hole 6452 is configured for the rotating shaft 640 to pass through. The first gear part 6453 is provided with a plurality of gears, and the plurality of gears are protruded relative to the first rotating part 6451.

It may be understood that there is a plurality of synchronization gears 6450, the plurality of synchronization gears 6450 are arranged in a series, and first gear parts 6453 of two adjacent synchronization gears 6450 meshes with each other. The synchronization gear 6450 may be integrally formed into a structural member to have a high structural strength.

A quantity, a size, and the like of the synchronization gear 6450 of the synchronization apparatus 645 may be designed based on models of a product, such as a specific form and a size. This is not strictly limited in this application. A larger quantity of synchronization gears 6450 and a smaller size of synchronization gears 6450 can release more space; and a smaller quantity of synchronization gears 6450, a larger size of synchronization gears 6450, and a smaller drive cumulative error of synchronization gears 6450, which helps improve motion accuracy.

The damping end 6433 of the first damping arm 643 further includes a second rotating part 6435 and a second gear part 6437 disposed around the second rotating part 6435. The second rotating part 6435 is connected to the connection segment 6438 of the first damping arm 643. An end that is of the second rotating part 6435 and that is away from the connection segment 6438 of the first damping arm 643 is fixedly connected to the second cam wheel 6434. The second gear part 6437 is provided with a plurality of gears. The plurality of gears of the second gear part 6437 are configured to mesh with the plurality of gears of the first gear part 6453. The second rotating part 6435 is provided with a second rotating hole 6436, and the second rotating hole 6436 penetrates through the second rotating part 6435. The second rotating hole 6436 is configured for the rotating shaft 640 to pass through.

When the first damping arm 643 rotates relative to the shaft seat 61, the damping end 6433 of the first damping arm 643 further meshed with the damping end 6443 of the second damping arm 644 by using a gear of the synchronization apparatus 645, so that magnitudes of rotation angles that are of the damping end 6433 of the first damping arm 643 and the damping end 6443 of the second damping arm 644 are the same, and rotation actions that are of the first damping arm 643 and the second damping arm 644 relative to the shaft seat 61 are synchronous. The first damping arm 643 and the second damping arm 644 drive the first bracket 62 and the second bracket 63 to move synchronously, and the first bracket 62 and the second bracket 63 drive the first frame 4 and the second frame 5 to move synchronously, thereby implementing relative folding or relative unfolding of the first frame 4 and the second frame 5, and improving use experience of a user.

With reference to FIG. 6, FIG. 8, and FIG. 9, the door plate 65 is mounted on the shaft seat 61. When the foldable display device 3 is in a process of switching between a flattened state and a folded state, the door plate 65 may be moved in a direction away from the shaft seat 61 and the door plate 65 may be moved in a direction close to the shaft seat 61. In other words, the door plate 65 is a rising/lowering plate body, and the door plate 65 may be connected to the shaft seat 61 in a rising/lowering manner. Specifically, in a process of unfolding the foldable display device 3, the door plate 65 moves in a direction away from the shaft seat 61, that is, the door plate 65 rises gradually to support the flexible display 7. In a process of folding the foldable display device 3, the door plate 65 moves in a direction close to the shaft seat 61, that is, the door plate 65 lowers gradually, to cooperate with the first support plate 66 and the second support plate 67 to form an accommodation space for accommodating the flexible display 7.

The first support plate 66 is rotatably connected to the first bracket 62, and the first support plate 66 is slidably connected to the shaft seat 61. The first support plate 66 may rotate relative to the first bracket 62, and the first support plate 66 may simultaneously slide relative to the shaft seat 61. In addition, there are gaps between the first support plate 66 and each of the first bracket 62 and the shaft seat 61, and the gaps are configured for the flexible circuit board 8 and the flexible heat sink 9 to pass through. The first support plate 66 includes a first support surface 660 and a first fastening surface 661 opposite to the first support surface 660. The first support surface 660 is used to support the flexible display 7. The first fastening surface 661 faces the shaft seat 61, and is used to fasten the flexible heat sink 9. The first support plate 66 and the second support plate 67 are distributed on two sides of the door plate 65. The second support plate 67 is rotatably connected to the second bracket 63, and the second support plate 67 is slidably connected to the shaft seat 61. The second support plate 67 may rotate relative to the second bracket 63, and the second support plate 67 may simultaneously slide relative to the shaft seat 61. In addition, there are gaps between the second support plate 67 and each of the second bracket 63 and the shaft seat 61, and the gaps are configured for the flexible circuit board 8 and the flexible heat sink 9 to pass through. The second support plate 67 includes a second support surface 670 and a second fastening surface 671 opposite to the second support surface 670. The second support surface 670 is used to support the flexible display 7. The second fastening surface 671 faces the shaft seat 61, and is used to fasten the flexible heat sink 9.

Before entering the accommodation cavity 611 through the first interval 615, the flexible heat sink 9 may be attached to the first frame 4 and is connected to a first side 41 that is of the first frame 4 and that is close to the flexible display 7, and enters the accommodation cavity 611 through a gap between the first support plate 66 and the shaft seat 61, a gap between the first support plate 66 and the first bracket 62, and a first interval 615. After leaving the accommodation cavity 611 through the second interval 616, the flexible heat sink 9 may be attached to the second frame 5 through a gap between the second support plate 67 and the shaft seat 61 and a gap between the second support plate 67 and the second bracket 63, and is connected to a first side 51 that is of the second frame 5 and that is close to the flexible display 7. The first side 41 of the first frame 4 and the first side 51 of the second frame 5 mounts the flexible display 7.

To avoid a case in which the flexible heat sink 9 moves in a length direction when the foldable display device 3 is folded or unfolded, resulting in large-scale deformation and a position change of the flexible heat sink 9, the flexible heat sink 9 may be located at two ends. Specifically, before the flexible heat sink 9 enters the accommodation cavity 611, the flexible heat sink 9 is fastened to the first fastening surface 661 of the first support plate 66. After the flexible heat sink 9 leaves the accommodation cavity 611, the flexible heat sink 9 is fastened to the second fastening surface 671 of the second support plate 67. That is, two opposite ends of a part of the flexible heat sink 9 in the rotating shaft assembly 6 are respectively fastened to a first fastening surface 661 that is of the first support plate 66 and that faces the shaft seat 61 and a second fastening surface 671 that is of the second support plate 67 and that faces the shaft seat 61. The flexible heat sink 9 may be fastened to the first fastening surface 661 of the first support plate 66 by using a fastening structure (for example, may be a screw or a bolt). The flexible heat sink 9 may be fastened to the second fastening surface 671 of the second support plate 67 by using a fastening structure (for example, may be a screw or a bolt). Alternatively, the flexible heat sink 9 may be fastened to the first fastening surface 661 of the first support plate 66 in an adhesive, a snap-fit, or another manner. Alternatively, the flexible heat sink 9 may be fastened to the second fastening surface 671 of the second support plate 67 in an adhesive, a snap-fit, or another manner.

To avoid that a middle segment of the flexible heat sink 9 is in a suspension state of free bending, a length of a part of the flexible heat sink 9 can be shortened, so that the flexible heat sink 9 is divided, in a length direction, into two segments with similar lengths, so that displacement and bending deformation that are generated, when the flexible heat sink 9 is folded or unfolded, by the foldable display device 3 are smaller, and displacement and a bending amount may be more easily controlled, and the flexible heat sink 9 may be located in a middle segment position. Specifically, when the flexible heat sink 9 is received in the accommodation cavity 611, the flexible heat sink 9 is fastened to a surface that is of the cross beam 612 and that faces the housing 60. The flexible heat sink 9 may be fastened to a surface of the cross beam 612 in the accommodation cavity 611 by using a fastening structure (for example, may be a screw or a bolt). Alternatively, the flexible heat sink 9 may be fastened to a surface of the cross beam 612 in the accommodation cavity 611 in an adhesive, a snap-fit, or another manner.

Before entering the accommodation cavity 611 through the first interval 615, the flexible circuit board 8 may be connected to an electronic element fastened to the first frame 4, that is, connected to a second side 42 that is of the first frame 4 and that is away from the flexible display 7, and is located by the first positioning apparatus, and may enter the accommodation cavity 611 through a gap between the first support plate 66 and the shaft seat 61, a gap between the first support plate 66 and the first bracket 62, and a first interval 615. After leaving the accommodation cavity 611 through the second interval 616, the flexible circuit board 8 may be located by the second positioning apparatus by a gap between the second support plate 67 and the shaft seat 61 and a gap between the second support plate 67 and the second bracket 63, and is connected to an electronic element fastened on the second frame 5, that is, connected to a second side 52 that is of the second frame 5 and that is away from the flexible display 7. The second side 42 of the first frame 4 is opposite to the first side 41 of the first frame 4. The second side 52 of the second frame 5 is opposite to the first side 51 of the second frame 5. The second side 42 of the first frame 4 and the second side 52 of the second frame 5 are configured to mount the electronic element. It may be understood that the first side 41 of the first frame 4 and the first side 51 of the second frame 5 may also be configured to mount the electronic element.

With reference to FIG. 5, FIG. 6, FIG. 8, and FIG. 9, in a process of folding the foldable display device 3, the door plate 65 moves in a direction close to the shaft seat 61, and an end that is of the first support plate 66 and that is close to the door plate 65 and an end that is of the second support plate 67 and that is close to the door plate 65 move in a direction away from the door plate 65. An end that is of the first support plate 66 and that is away from the door plate 65 and an end that is of the second support plate 67 and that is away from the door plate 65 move close to each other, and the door plate 65, the first support plate 66, and the second support plate 67 are automatically avoided, and jointly form an accommodation space, where the accommodation space is used to accommodate the flexible display 7.

In a process of folding the foldable display device 3, the first support plate 66 and the second support plate 67 further drive the flexible heat sink 9 to move. The flexible heat sink 9 includes three parts based on a positional relationship between the first support plate 66 and the second support plate 67, and the three parts are respectively a first part 91, a second part 92, and a third part 93. The first part 91 of the flexible heat sink 9 is located on a side that is of the first support plate 66 and that is away from the second support plate 67, the second part 92 of the flexible heat sink 9 is located between the first support plate 66 and the second support plate 67, and the third part 93 of the flexible heat sink 9 is located on a side that is of the second support plate 67 and that is away from the first support plate 66. The first part 91 of the flexible heat sink 9 is fastened to the first support plate 66 and the first frame 4, a middle position of the second part 92 of the flexible heat sink 9 is fastened to the cross beam 612 between the first support plate 66 and the second support plate 67, and another part of the second part 92 of the flexible heat sink 9 is in an unfastened state between the first support plate 66 and the cross beam 612 and between the second support plate 67 and the cross beam 612. The third part 93 of the flexible heat sink 9 is fastened to the second support plate 67 and the second frame 5. When the first support plate 66 and the second support plate 67 drive the flexible heat sink 9 to move, a shape of the second part 92 of the flexible heat sink 9 changes and bends into an approximate heart shape, and is located on outer sides of the first support plate 66, the door plate 65, and the second support plate 67.

In a process of folding the foldable display device 3, the first positioning apparatus and the second positioning apparatus also move simultaneously. The first positioning apparatus and the second positioning apparatus drive the flexible circuit board 8 to move. The flexible circuit board 8 includes three parts based on a positional relationship between the first positioning apparatus and the second positioning apparatus, and the three parts are respectively a first part 83, a second part 84, and a third part 85. The first part 83 of the flexible circuit board 8 is located on a side that is of the first positioning apparatus and that is away from the second positioning apparatus, the second part 84 of the flexible circuit board 8 is located between the first positioning apparatus and the second positioning apparatus, and the third part 85 of the flexible circuit board 8 is located on a side that is of the second positioning apparatus and that is away from the first positioning apparatus. The first part 83 of the flexible circuit board 8 is fastened to the first positioning apparatus and the first frame 4, and a second part 84 of the flexible circuit board 8 is in an unfastened state between the first positioning apparatus and the second positioning apparatus. The third part 85 of the flexible circuit board 8 is fastened to the second positioning apparatus and the second frame 5. When the first positioning apparatus and the second positioning apparatus drive the flexible circuit board 8 to move, a shape of the second part 84 of the flexible circuit board 8 changes and bends into an approximate droplet of water, and is located outer sides of the first support plate 66, the door plate 65, and the second support plate 67.

With reference to FIG. 3, FIG. 4, FIG. 8, and FIG. 9, in a process of unfolding the foldable display device 3, the door plate 65 moves in a direction away from the shaft seat 61. When the foldable display device 3 is completely in a flattened state, a support surface 650 of the door plate 65 is flush with the first support surface 660 of the first support plate 66 and the second support surface 670 of the second support plate 67. In other words, when the foldable display device 3 is in the flattened state, the support surface 650 of the door plate 65, the first support surface 660 of the first support plate 66, and the second support surface 670 of the second support plate 67 are used to enable the flexible display 7 (as shown in FIG. 6) to be in the flattened state. When the user performs a touch operation, the door plate 65, the first support plate 66, and the second support plate 67 can provide flat and strong support for the flexible display 7, thereby improving operation experience and picture viewing experience of the user.

In a process of unfolding the foldable display device 3, the first support plate 66 and the second support plate 67 further drive the flexible heat sink 9 to move. The second part 92 of the flexible heat sink 9 becomes an approximate horizontal shape and is attached to the first support plate 66, the cross beam 612, and the second support plate 67.

In a process of unfolding the foldable display device 3, the first positioning apparatus and the second positioning apparatus also move simultaneously. The first positioning apparatus and the second positioning apparatus drive the flexible circuit board 8 to move. A shape of the second part 84 of the flexible circuit board 8 changes, and is in a free bending state in the rotating shaft assembly 6.

In this application, the flexible circuit board 8 and the flexible heat sink 9 may pass through the rotating shaft assembly 6 in a same area of the rotating shaft assembly 6, to effectively use a space of the rotating shaft assembly 6, and the flexible heat sink 9 may transfer heat of the first frame 4 to the second frame 5. The flexible circuit board 8 and the flexible heat sink 9 are redundant in the rotating shaft assembly 6, to avoid fractures of the flexible circuit board 8 and the flexible heat sink 9 and a larger space occupied by the foldable display device 3. By fastening two ends of the flexible heat sink 9 to the first support plate 66 and the second support plate 67, a structure inside the rotating shaft assembly 6 may be used, so that displacement and bending deformation that are generated when the flexible heat sink 9 is folded or unfolded by the foldable display device 3 are smaller, and displacement and a bending amount may be easily controlled. The flexible circuit board 8 and the flexible heat sink 9 are redundant in the accommodation cavity 611 consisting of the shaft seat 61 and the housing 60, so that the flexible circuit board 8 and the flexible heat sink 9 may be redundant in the rotating shaft assembly 6 by using a structure inside the rotating shaft assembly 6. A cross beam 612 is formed in the accommodation cavity 611 by using the shaft seat 61, so that a case in which the flexible circuit board 8 and the flexible heat sink 9 detach from the accommodation cavity 611 is avoided. By fastening a middle segment of the flexible heat sink 9 to the cross beam 612 of the shaft seat 61, the flexible heat sink 9 can be divided, in a length direction, into two segments with similar lengths, so that displacement and bending deformation that are generated when the flexible heat sink 9 is folded or unfolded by the foldable display device 3 are smaller, and displacement and a bending amount may be more easily controlled. The flexible circuit board 8 is located on the first frame 4 and the second frame 5 by using the first positioning apparatus and the second positioning apparatus, to avoid a case in which displacement and bending deformation that are generated, when the flexible circuit board 8 is folded or unfolded, by the foldable display device 3 are smaller, and displacement and a bending amount may be easily controlled.

Figure 12:
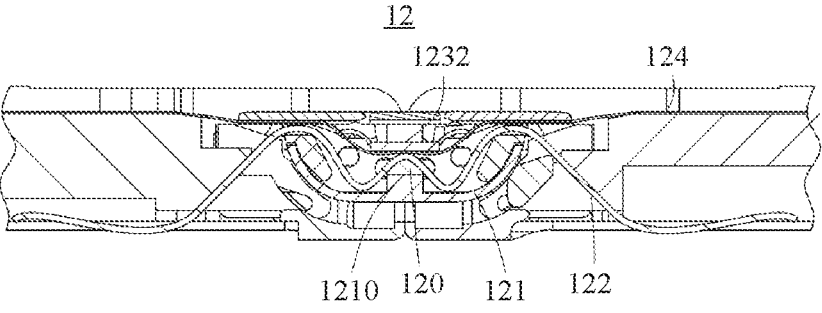
FIG. 12 is a schematic sectional view of a foldable display device in a flattened state according to a second embodiment of this application.
Figure 13:
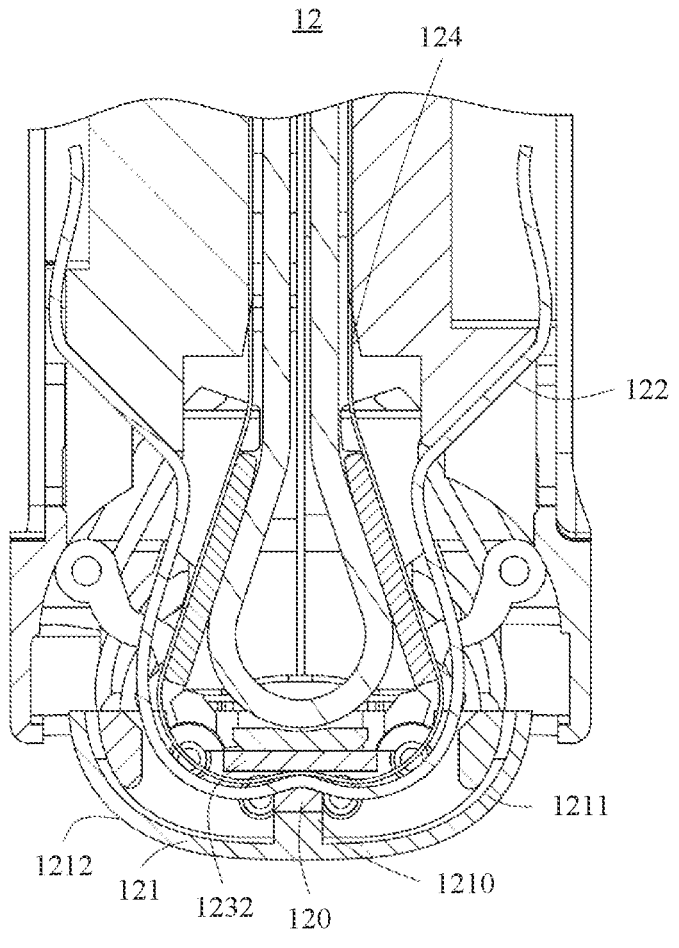
FIG. 13 is a schematic sectional view of a foldable display device in a folded state according to a second embodiment of this application.
Figure 14:
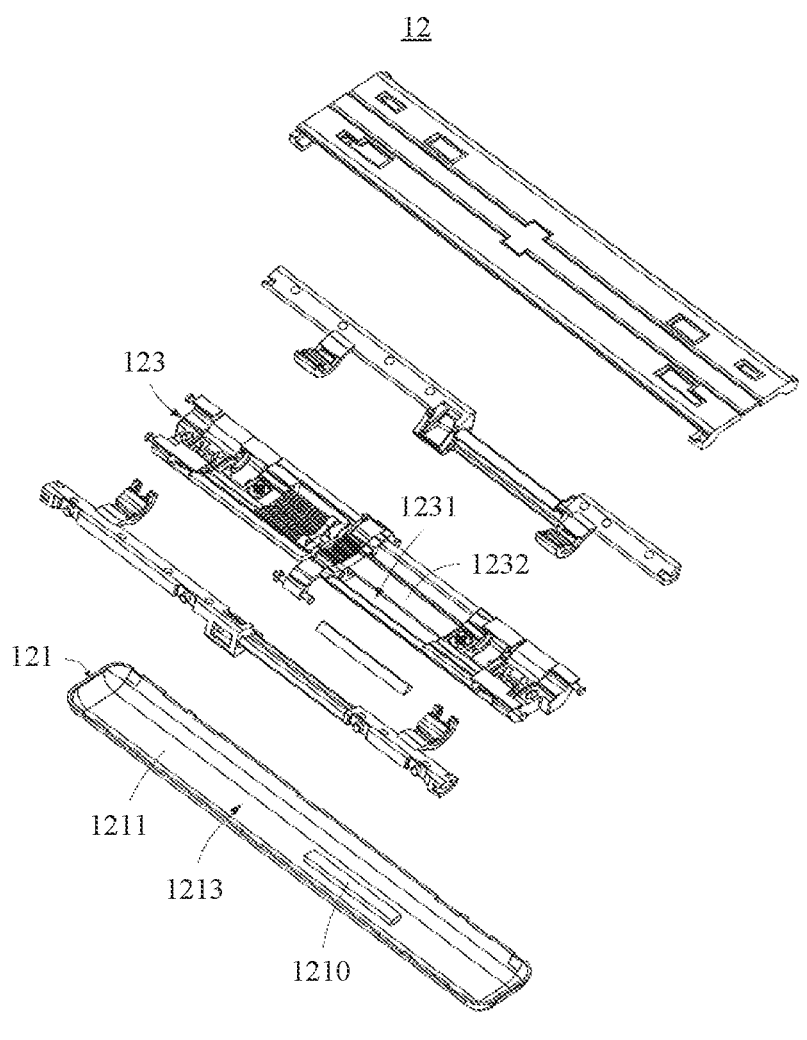
FIG. 14 is a schematic exploded view of a rotating shaft assembly of a foldable display device in a flattened state according to a second embodiment of this application.

Refer to FIG. 12 to FIG. 14. FIG. 12 is a schematic sectional view of a foldable display device in a flattened state according to a second embodiment of this application; FIG. 13 is a schematic sectional view of a foldable display device in a folded state according to a second embodiment of this application; and FIG. 14 is a schematic exploded view of a rotating shaft assembly of a foldable display device in a flattened state according to a second embodiment of this application. The foldable display device in the second embodiment is similar to the foldable display device in the first embodiment, and a difference lies in that the foldable display device 12 in the second embodiment further includes a buffer member 120, and the housing 121 in the second embodiment further includes a positioning member 1210. Specifically:

To locate the flexible circuit board 122 at a middle segment position, the housing 121 further includes an inner housing surface 1211 and the positioning member 1210, and the inner housing surface 1211 is opposite to the housing surface 1212. The positioning member 1210 may be fixedly mounted on the inner housing surface 1211 and is located in the mounting cavity 1213. The positioning member 1210 may further be a structure that protrudes from the inner housing surface 1211 of the housing 121. A shaft seat 123 is located above the positioning member 1210 in the mounting cavity 1213. The accommodation groove 1231 is formed on a part of the shaft seat 123 above the positioning member 1210. The cross beam 1232 is located above the positioning member 1210, is separated from the positioning member 1210, and is configured for the flexible circuit board 122 and the flexible heat sink 124 to pass through. The positioning member 1210 and the cross beam 1232 jointly clamp the flexible circuit board 122 and the flexible heat sink 124, so that the flexible circuit board 122 and the flexible heat sink 124 are clamped between the positioning member 1210 and the cross beam 1232. In this case, the positioning member 1210 and the cross beam 1232 may jointly locate middle segment positions of the flexible circuit board 122 and the flexible heat sink 124, so that the flexible circuit board 122 and the flexible heat sink 124 may be divided, in a length direction, into two segments with similar lengths. Therefore, displacement and bending deformation that are generated, when the flexible circuit board 122 and the flexible heat sink 124 are folded or unfolded, by the foldable display device 12 are similar and smaller, and displacement and a bending amount may be more easily controlled.

To avoid damage to the flexible circuit board 122 by the positioning member 1210, the buffer member 120 is further disposed between the positioning member 1210 and the cross beam 1232. The buffer member 120 is disposed on the positioning member 1210 and is separated from the cross beam 1232. The buffer member 120 may be fastened to the positioning member 1210. The buffer member 120 is made of an elastic material, for example, rubber or foam. The buffer member 120 may avoid damage to the flexible circuit board 122 by the positioning member 1210 through elastic deformation. In addition, the buffer member 120 may cause a connection position between the flexible circuit board 122 and the cross beam 1232 to be slightly changed, to avoid a risk of a fracture due to the stretched flexible circuit board 122.

In this application, the positioning member 1210 may clamp the flexible circuit board 122 and the flexible heat sink 124 between the positioning member 1210 and the cross beam 1232, so that the positioning member 1210 and the cross beam 1232 jointly form a positioning point at a middle segment of the flexible circuit board 122, and locate the flexible circuit board 122 at a middle segment position, and the flexible circuit board 122 can be divided, in a length direction, into two segments with similar lengths, on two sides of the positioning member 1210, and therefore displacement and bending deformation that are generated, when the flexible circuit board 122 is folded, by the foldable display device are similar and smaller, and displacement and a bending amount may be more easily controlled; and damage to the flexible circuit board 122 by the positioning member 1210 can be avoided through elastic deformation of the buffer member 120, in addition, a connection position between the flexible circuit board 122 and the cross beam 1232 can be slightly changed by using the buffer member 120, to avoid a risk of a fracture due to the stretched flexible circuit board 122.

Finally, it should be noted that the foregoing embodiments are only used to describe the technical solutions of this application, but not intended to constitute any limitation. Although this application is described in detail with reference to the foregoing exemplary embodiments, a person of ordinary skill in the art should understand that modifications or equivalent replacements can be made to the technical solutions of this application without departing from the spirit and scope of the technical solutions of this application.

What is claimed is:

1. A foldable display device, comprising:

a first frame;

a second frame, wherein a first side of the first frame and a first side of the second frame are configured to have a flexible display mounted thereon, a second side of the first frame and a second side of the second frame are configured to have an electronic element mounted thereon, the first side of the first frame is opposite to the second side of the first frame, and the first side of the second frame is opposite to the second side of the second frame;

a rotating shaft assembly comprising a housing, a shaft seat mounted on the housing, a door plate mounted on the shaft seat, a first support plate, and a second support plate, wherein the first support plate and the second support plate are distributed on two sides of the door plate, the shaft seat and the housing jointly form an accommodation cavity, the shaft seat comprises an accommodation groove formed thereon, the accommodation groove penetrates through the shaft seat, the shaft seat and the housing jointly form the accommodation cavity at the accommodation groove, a cross beam is further formed on the shaft seat at the accommodation groove, and the cross beam is separated from the housing;

a flexible heat sink, wherein two opposite ends of the flexible heat sink are connected to the first side of the first frame and the first side of the second frame, and two opposite ends of a part of the flexible heat sink in the rotating shaft assembly are respectively fastened to a first fastening surface that is of the first support plate and that faces the shaft seat and a second fastening surface that is of the second support plate and that faces the shaft seat; and a flexible circuit board, wherein two opposite ends of the flexible circuit board are connected to the second side of the first frame and the second side of the second frame, and the flexible heat sink and the flexible circuit board pass through the rotating shaft assembly, wherein:

the flexible heat sink and the flexible circuit board are partially received in the accommodation cavity, a middle segment position of the flexible heat sink is fastened to a surface of the cross beam facing the housing, and in a process of folding the foldable display device, an end that is of the first support plate and that is close to the door plate and an end that is of the second support plate and that is close to the door plate are configured to move in a direction away from the door plate, and an end that is of the first support plate and that is away from the door plate and an end that is of the second support plate and that is away from the door plate are configured to move closer to each other.

2. The foldable display device according to claim 1, wherein:

the flexible heat sink covers the flexible circuit board in the rotating shaft assembly.

3. The foldable display device according to claim 1, wherein:

the cross beam extends from a first side wall of the shaft seat near the accommodation groove to a second side wall that is opposite to the first side wall, and is separated from another side wall of the shaft seat near the accommodation groove.

4. The foldable display device according to claim 3, wherein the cross beam and another side wall of the shaft seat near the accommodation groove form a first interval and a second interval, and the flexible heat sink and the flexible circuit board enter the accommodation cavity through the first interval and leave the accommodation cavity through the second interval.

5. The foldable display device according to claim 1, wherein the housing comprises an inner housing surface and a positioning member, the positioning member is fixedly mounted on the inner housing surface and is located in the accommodation cavity, and the cross beam and the positioning member are separated from each other and are jointly located in middle segment positions of the flexible circuit board and the flexible heat sink.

6. The foldable display device according to claim 5, wherein the foldable display device further comprises a buffer member, the buffer member is disposed on the positioning member and is separated from the cross beam, and the buffer member is configured to avoid damage to the flexible circuit board by the positioning member through elastic deformation.

7. The foldable display device according to claim 1, further comprising:

a first bracket rotatably connected to the first support plate;

a second bracket rotatably connected to the second support plate, wherein the first bracket and the second bracket are rotatably connected to the shaft seat;

a first synchronization arm slidably connected to the first bracket and rotatably connected to the first bracket;

a second synchronization arm slidably connected to the second bracket and rotatably connected to the second bracket; and a cam wheel structure disposed on the shaft seat and comprising a concave and convex structure, wherein the first synchronization arm and the second synchronization arm are connected to the cam wheel structure through the concave and convex structure to implement damping of rotation of the first bracket and the second bracket.

8. A method, comprising:

providing a foldable display device comprising:

a first frame, a second frame, wherein a first side of the first frame and a first side of the second frame are configured to have a flexible display mounted thereon, a second side of the first frame and a second side of the second frame are configured to have an electronic element mounted thereon, the first side of the first frame is opposite to the second side of the first frame, and the first side of the second frame is opposite to the second side of the second frame, a rotating shaft assembly comprising a housing, a shaft seat mounted on the housing, a door plate mounted on the shaft seat, a first support plate, and a second support plate, wherein the first support plate and the second support plate are distributed on two sides of the door plate, the shaft seat and the housing jointly form an accommodation cavity, the shaft seat comprises an accommodation groove formed thereon, the accommodation groove penetrates through the shaft seat, the shaft seat and the housing jointly form the accommodation cavity at the accommodation groove, a cross beam is further formed on the shaft seat at the accommodation groove, and the cross beam is separated from the housing, a flexible heat sink, wherein two opposite ends of the flexible heat sink are connected to the first side of the first frame and the first side of the second frame, and two opposite ends of a part of the flexible heat sink in the rotating shaft assembly are respectively fastened to a first fastening surface that is of the first support plate and that faces the shaft seat and a second fastening surface that is of the second support plate and that faces the shaft seat, and a flexible circuit board, wherein two opposite ends of the flexible circuit board are connected to the second side of the first frame and the second side of the second frame, and the flexible heat sink and the flexible circuit board pass through the rotating shaft assembly, wherein the flexible heat sink and the flexible circuit board are partially received in the accommodation cavity, and a middle segment position of the flexible heat sink is fastened to a surface of the cross beam facing the housing; and folding the foldable display device.

9. The method according to claim 8, wherein folding the foldable display device comprises moving an end that is of the first support plate and that is close to the door plate and an end that is of the second support plate and that is close to the door plate in a direction away from the door plate.

10. The method according to claim 9, further comprising moving an end that is of the first support plate and that is away from the door plate and an end that is of the second support plate and that is away from the door plate closer to each other.

11. The method according to claim 8, wherein:

the cross beam extends from a first side wall of the shaft seat near the accommodation groove to a second side wall that is opposite to the first side wall, and is separated from another side wall of the shaft seat near the accommodation groove.

12. A display device, comprising:

a first frame;

a second frame, wherein a first side of the first frame and a first side of the second frame are configured to have a flexible display mounted thereon, a second side of the first frame and a second side of the second frame are configured to have an electronic element mounted thereon, the first side of the first frame is opposite to the second side of the first frame, and the first side of the second frame is opposite to the second side of the second frame;

a rotating shaft assembly comprising a housing, a shaft seat mounted on the housing, a door plate mounted on the shaft seat, a first support plate, and a second support plate, wherein the first support plate and the second support plate are distributed on two sides of the door plate, the shaft seat and the housing jointly form an accommodation cavity, the shaft seat comprises an accommodation groove formed thereon, the accommodation groove penetrates through the shaft seat, the shaft seat and the housing jointly form the accommodation cavity at the accommodation groove, a cross beam is further formed on the shaft seat at the accommodation groove, and the cross beam is separated from the housing;

a flexible heat sink, wherein two opposite ends of the flexible heat sink are connected to the first side of the first frame and the first side of the second frame, and two opposite ends of a part of the flexible heat sink in the rotating shaft assembly are respectively fastened to a first fastening surface that is of the first support plate and that faces the shaft seat and a second fastening surface that is of the second support plate and that faces the shaft seat; and a flexible circuit board, wherein two opposite ends of the flexible circuit board are connected to the second side of the first frame and the second side of the second frame, and the flexible heat sink and the flexible circuit board pass through the rotating shaft assembly, wherein:

the flexible heat sink and the flexible circuit board are partially received in the accommodation cavity, a middle segment position of the flexible heat sink is fastened to a surface of the cross beam facing the housing.

13. The display device according to claim 12, wherein:

the flexible heat sink covers the flexible circuit board in the rotating shaft assembly.

14. The display device according to claim 12, wherein:

the cross beam extends from a first side wall of the shaft seat near the accommodation groove to a second side wall that is opposite to the first side wall, and is separated from another side wall of the shaft seat near the accommodation groove.

15. The foldable display device according to claim 1, wherein the flexible heat sink is made of a thermally conductive material comprising graphite or carbon fiber.

16. The foldable display device according to claim 1, wherein:

in a process of unfolding the foldable display device, the door plate moves in a direction away from the shaft seat to support the flexible display; and in a process of folding the foldable display device, the door plate moves in a direction close to the shaft seat to cooperate with the first support plate and the second support plate to form an accommodation space for accommodating the flexible display.

17. The foldable display device according to claim 1, wherein when the foldable display device is in a flattened state, a support surface of the door plate is flush with a first support surface of the first support plate and a second support surface of the second support plate.

18. The foldable display device according to claim 7, wherein the first bracket is fixedly connected to the first frame, and the second bracket is fixedly connected to the second frame.

19. The foldable display device according to claim 7, further comprising:

a synchronization apparatus mounted on the shaft seat and rotatably connected to the shaft seat, wherein the first synchronization arm meshes with the synchronization apparatus by using a gear, and the second synchronization arm meshes with the synchronization apparatus by using a gear.

20. The foldable display device according to claim 7, further comprising:

a rotating shaft mounted on the shaft seat; and an elastic member sleeved onto the rotating shaft assembly, wherein the cam wheel structure is sleeved onto the rotating shaft to abut on an end of the elastic member, and the elastic member is configured to provide an opening/closing damping force.

\* \* \* \* \*